(12) United States Patent
Gargash

(10) Patent No.: US 11,876,481 B2
(45) Date of Patent: Jan. 16, 2024

(54) SOLAR POWER GENERATOR

(71) Applicant: Abdul Jabbar Abdulla Ali Gargash, Dubai (AE)

(72) Inventor: Abdul Jabbar Abdulla Ali Gargash, Dubai (AE)

( * ) Notice: Subject to any disclaimer, the term of this patent is extended or adjusted under 35 U.S.C. 154(b) by 163 days.

(21) Appl. No.: 17/753,369

(22) PCT Filed: Sep. 15, 2020

(86) PCT No.: PCT/IB2020/058554
§ 371 (c)(1),
(2) Date: Mar. 1, 2022

(87) PCT Pub. No.: WO2021/053503
PCT Pub. Date: Mar. 25, 2021

(65) Prior Publication Data
US 2022/0302873 A1     Sep. 22, 2022

(30) Foreign Application Priority Data
Sep. 20, 2019   (WO) .................. PCT/IB2019/057976

(51) Int. Cl.
*H02S 30/20*     (2014.01)
*H02S 40/22*     (2014.01)
*H02J 3/38*      (2006.01)

(52) U.S. Cl.
CPC .............. *H02S 30/20* (2014.12); *H02J 3/381* (2013.01); *H02S 40/22* (2014.12); *H02J 2300/24* (2020.01)

(58) Field of Classification Search
CPC .... F21S 11/002; H01L 31/042; H01L 31/048; H01L 31/0543; H02S 20/23; H02S 30/20; H02S 40/22; H02S 40/36
See application file for complete search history.

(56) References Cited

U.S. PATENT DOCUMENTS

| | | | | |
|---|---|---|---|---|
| 4,411,490 A | * | 10/1983 | Daniel | ................ H01L 31/0547 136/246 |
| 11,038,073 B2 | * | 6/2021 | Bae | .................... H01L 31/02327 |
| 2011/0030764 A1 | * | 2/2011 | Seo | ...................... H01L 31/0543 136/246 |
| 2013/0104979 A1 | * | 5/2013 | Huang | ................ H01L 31/0543 136/259 |

FOREIGN PATENT DOCUMENTS

| | | | | | |
|---|---|---|---|---|---|
| CN | 105577081 A | * | 5/2016 | ............. | H02S 40/00 |
| CN | 106877809 A | * | 6/2017 | ............. | H02S 40/00 |

* cited by examiner

*Primary Examiner* — Golam Mowla
(74) *Attorney, Agent, or Firm* — Patshegen IP; Moshe Pinchas

(57) ABSTRACT

The present invention relates to an energy generation by means of solar power, especially to generators utilizing solar power to generate electricity.
A solar power generator (20) comprising foldable elongated sheet (1) forming a four-side box frame structure (13). The generator (20) further comprises four photovoltaic solar panels (5) mounted within the four-side box frame structure (13). The open side of the four-side box frame structure (13) comprises a cover (8) having a hole (81) where a solar bulb (9) is mounted. The solar bulb (9) is configured so that a light from outer environment can travel through the solar bulb (9) into the four-side box frame structure (13) made by elongated sheet (1) and onto the photovoltaic solar panels (5) disposed therein generating electricity.

11 Claims, 12 Drawing Sheets

SOLAR POWER GENERATOR

The present invention relates to an energy generation by means of solar power, especially to generators utilizing solar power to generate electricity.

The solar power generators are well known in the prior art for generating electricity from sunlight using photovoltaic system. The photovoltaic system comprises photovoltaic solar modules absorbing sunlight as a source of energy to generate direct current electricity. A photovoltaic module is a packaged, connected assembly of photovoltaic solar cells available in different voltages and wattages. The photovoltaic or solar module should be made such as to withstand environmental or weather impact. Usually, solar modules are encompassed in resistant enclosures. The following enclosures considerably increase an overall cost of solar modules. Moreover, the solar modules should be cleaned in order to keep clean a sunlight receiving surfaces of the solar modules. Necessary rigid structure and cleaning of the solar modules increases the cost of design and manufacturing as well as cost of service.

A lot of resources are also invested in order to increase the power generation efficiency even by 1 to 2%. Efficiency of the solar power generators also depends on the environment where it is installed—contaminated air (sand and other particles) contaminate surfaces of the solar cells decreasing its efficiency. Accordingly, the world is looking for new solutions to increase not only the power generation efficiency even further, but, also design such a solar power generator which would not be influenced or will be less influences by the environment.

The prior art discloses a double-sided solar cell module equipped with solar light bulb and reflector (Korean patent application No. KR20190006472) where the solar cells are disposed on both sides of the solar cell module and the light is transferred to another side of the module by means of solar bulb and reflector.

The aim of the invention is to design an even more efficient (more energy density) and environment independent (resistant to a contamination) solar power generator.

The aim of the invention is reached by design of a solar power generator comprising a four-side box frame structure made from an elongated sheet. The elongated sheet has three equally distributed folding lines dividing the elongated sheet in four generally equal parts so that by folding the elongated sheet a four-side box frame structure is formed. The folding lines form respective corners of the four-side box frame structure.

The elongated sheet may be made from cardboard sheet or from a plastic sheet. The elongated sheet comprises a thick part and a thin part that is thinner than the thick part. The photovoltaic solar panels are arranged on the thick part of the elongated sheet. The thin part of the elongated sheet is used for insertion or positioning of the solar power generator for example in additional casing or container.

The solar power generator comprises four photovoltaic solar panels attached to the inner walls of the four-side box frame structure. In un-assembled or un-folded state of the elongated sheet, each photovoltaic solar panel is mounted onto each part of the cardboard sheet. Each part is divided by folding line allowing to fold the elongated sheet into the a four-side box frame structure, in result of which four photovoltaic solar panels are faced inwards. In one of the embodiments of the invention each photovoltaic solar panel may be mounted to each part of the elongated sheet by means of double-sided adhesive tape.

The elongated sheet comprises embedded metal contacts positioned in an area of the folding lines of the elongated sheet so that the metal contacts provide an electrical connection between neighbouring photovoltaic solar panels forming common electrical circuit. Additionally, the electrodes are connected to the photovoltaic solar panels or to the metal contacts forming an electric output from the solar power generator. The electrodes allow to connect the solar power generator in an overall network of the solar power generator system. The metal contacts, the electrodes and the photovoltaic solar panels are connected in one circuit so that the generated electricity can be transferred further from the solar power generator. Moreover, a use of embedded contacts and electrodes allow to create a common circuit with one output, which eases the installation as well as assembly of the present solar power generator.

The solar power generator further comprises a cover having a hole and said cover is mounted onto the open side of the four-side box frame structure. The hole of the cover is adjusted to receive a solar bulb.

The solar bulb is also known as a solar bottle bulb, which usually is installed in the roof of homes with the purpose of refracting sunlight in order to light up a room. The solar bulbs may be made of cheap, durable and readily available materials to produce high quality natural lighting within the room or housing to be lighted up. The following solution is utilized in the present invention. The solar bulb comprises a transparent container filed with a transparent liquid and as mentioned above the solar bulb is mounted in the hole of the cover. The solar bulb is configured so that a light from outer environment can travel through the solar bulb into the four-side box frame structure and onto the photovoltaic solar panels disposed therein generating electricity. The transparent liquid is a water and it further contains a bleach to inhibit algal growth. The transparent liquid further contains light enhancing substance, preferably phosphorous base substance. The solar bulb further comprises auxiliary reflection elements for increasing a light scattering within the solar power generator.

The shape of solar bulb may be made in many configurations. The solar bulb may be for example in a shape of cube, cylinder and bottle. The shape of the solar bulb may be also tailor made. Moreover, the solar bulb may further comprises auxiliary reflection elements for increasing a light scattering within the housing.

A small part of the solar bulb is left outside while the rest of it protrudes into the housing. Sealant is put around the hole made in the housing to keep it weatherproof. The refractive properties of water ensures that the light from the sun that reaches the inside of the solar bulb becomes (mini-directional mimicking an electric light bulb. Adding bleach to the water inhibits algal growth and ensures a high quality light keeping the water clear for a longer time. The solar bulb functions like a deck prism.

In another embodiment of the invention a solar power generator unit is formed, wherein the solar power generator unit comprises at least two solar power generators as described above. The solar power generators are physically and electrically interconnected to each other. For example the solar power generators may be connected to each other by means of a double-sided adhesive tape. The electrodes of each solar power generator are connected to the electrodes of the neighbouring solar power generator forming a common circuit with two unit output electrodes.

The solar power generator unit further comprises a container with four side walls and a base. The base comprises an array of protrusions and grooves positioned on said protrusion. The grooves are configured to receive the thin part of the elongated sheet so that the solar power generators are securely positioned within the container. The cover covers entire open side of the container. The cover comprises multiple holes disposed so that each hole is positioned above each solar power generator and the solar bulbs are mounted in respective holes of the cover.

The present invention (the solar power generator and solar power generator unit) is easy to manufacture as provide easy and cost-effective assembly. It further increases efficiency compared to the designs of the prior art. It has more energy density compared to existing solutions as well as provides reduced shading loses.

Hereinafter, embodiments of the present invention will be described in detail with references to the accompanying figures.

Other objects and features of the present invention will become apparent when viewed in light of the detailed description of the preferred embodiment when taken in conjunction with the attached drawings and appended claims.

Figure 1:
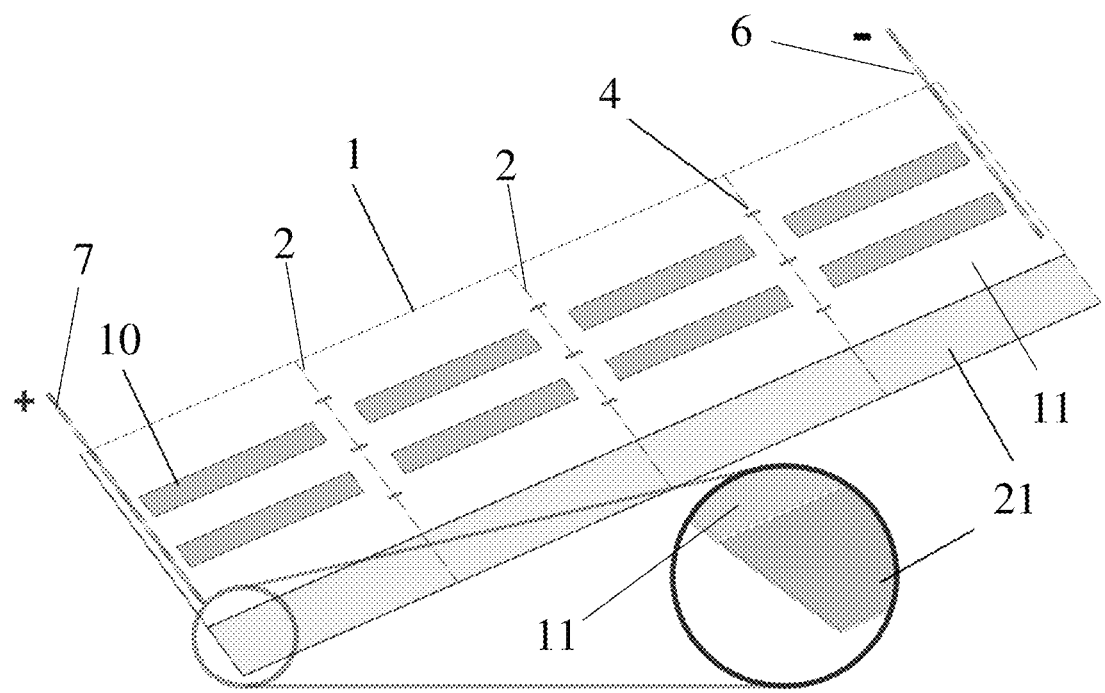
FIG. 1 is a perspective view of elongated cardboard sheet (1) in un-folded state.
Figure 2:
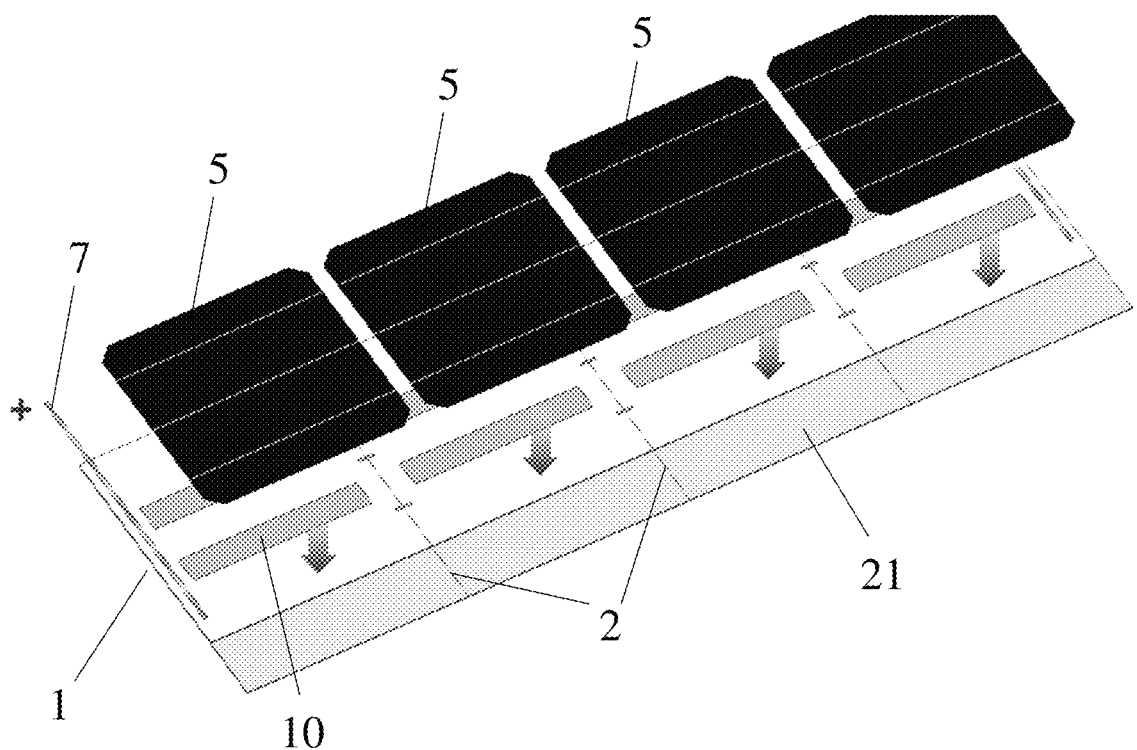
FIG. 2 is a perspective view of elongated cardboard sheet (1) in un-folded state illustrating attachment of four photovoltaic solar panels (5) to the elongated cardboard sheet (1) by means of double-sided adhesive tape (10).
Figure 3:
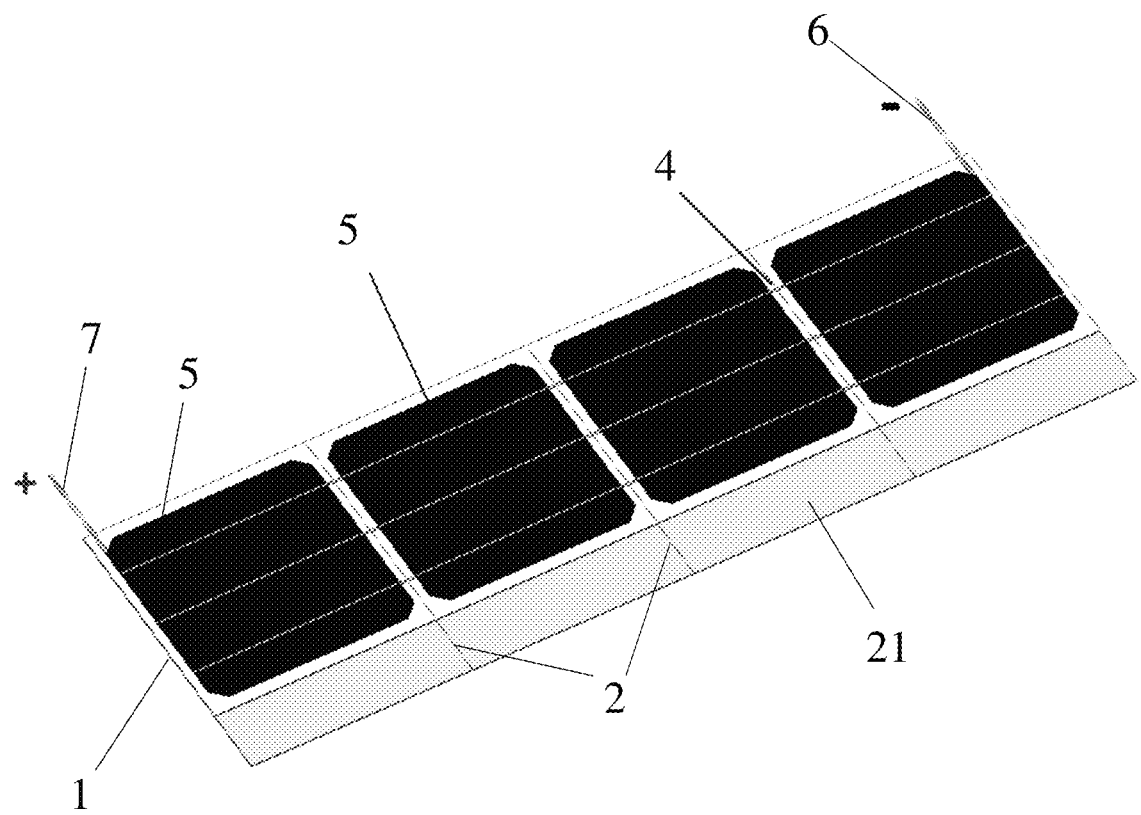
FIG. 3 is a perspective view of elongated cardboard sheet (1) in un-folded state with four photovoltaic solar panels (5) attached thereto.
Figure 4:
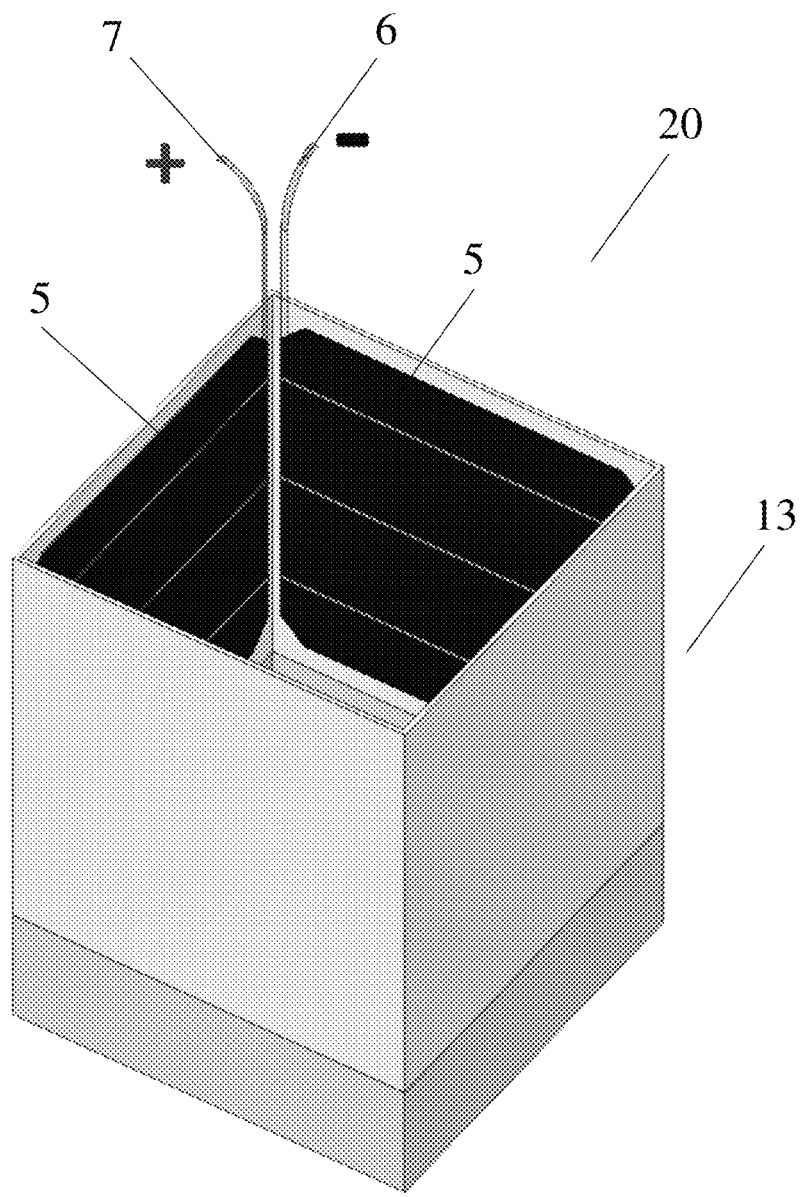
FIG. 4 is a perspective view of a solar power generator (20) comprising a four-side box frame structure (13) made by folding the elongated cardboard sheet (1) as seen in FIGS. 1 to 3.
Figure 5:
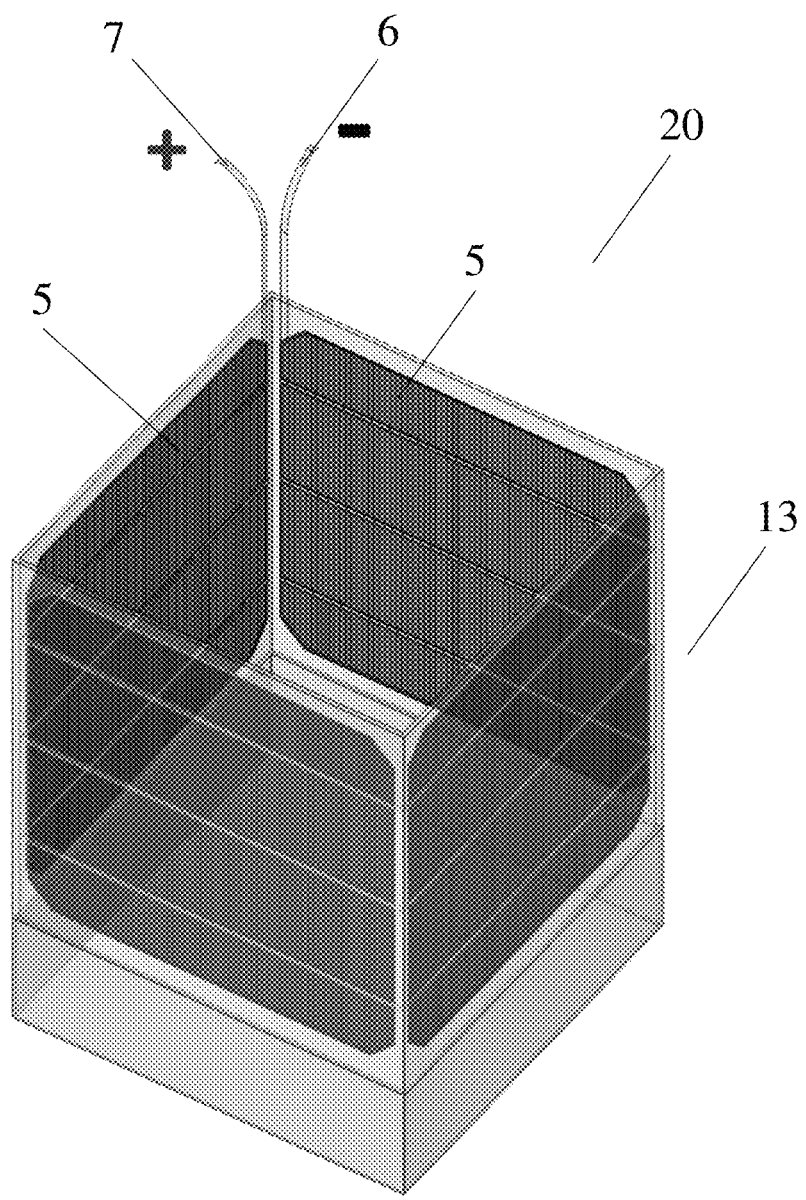
FIG. 5 is a transparent or X-ray view of the solar power generator (20) as seen in FIG. 4 for ease of understanding arrangement of parts.

FIGS. 1 to 3 illustrate a layout of elongated sheet (1) which folded forms a four-side box frame structure (13) as illustrated at least in FIGS. 4 to 10.

FIGS. 1 to 3 illustrate an elongated cardboard sheet (1) having three equally distributed folding lines (2) dividing the elongated cardboard sheet (1) in four generally equal parts (3) so that the elongated cardboard sheet (1) is foldable forming a four-side box frame structure (13) as seen in FIGS. 4 to 10. The elongated cardboard sheet (1) is made in such a configuration that it comprises a thick part (11) and a thin part (21) that is thinner than the thick part (11). The thick part (11) of the elongated cardboard sheet (1) is configured to receive photovoltaic solar panels (5). The thin part (21) of the elongated cardboard sheet (1) is configured to be inserted into a container (31) as seen in FIGS. 11 to 14 for building a solar power generator unit (30) forming reliable connection between the container (31) and the four-side box frame structure (13). Additionally metal contacts (4) are embedded in the elongated cardboard sheet (1) in an area of the folding lines (2) of the elongated sheet (1) configured to be connected to the photovoltaic solar panels (5) in result of which the metal contacts (4) provide an electrical connection between neighbouring photovoltaic solar panels (5). Each photovoltaic solar panel (5), altogether four, is mounted onto each respective part (3) of the elongated cardboard sheet (1). Four photovoltaic solar panels (5) are mounted on one side of the elongated cardboard sheet (1) which faces inwards when the elongated cardboard sheet (1) is folded in the four-side box frame structure (13). Hence, all four photovoltaic solar panels (5) are within the four-side box frame structure (13). Each photovoltaic solar panel (5) is mounted to each part (3) of the elongated sheet (1) by means of double-sided adhesive tape (10). All four photovoltaic solar panels (5) are electrically interconnected to each other through the metal contacts (4) forming common circuit. The circuit further comprises two electrodes (6; 7) connected thereto. Both electrodes (6; 7) serve as the output electrodes (6; 7) of the solar power generator (20), where one electrode (6) is negative terminal and another electrode (7) is positive terminal. Implementation of aforementioned solution where photovoltaic solar panels (5), metal contacts (4) and electrodes (6; 7) as the output form one common circuit makes production/assembly of the solar power generator (20) much easier.

Figure 6:
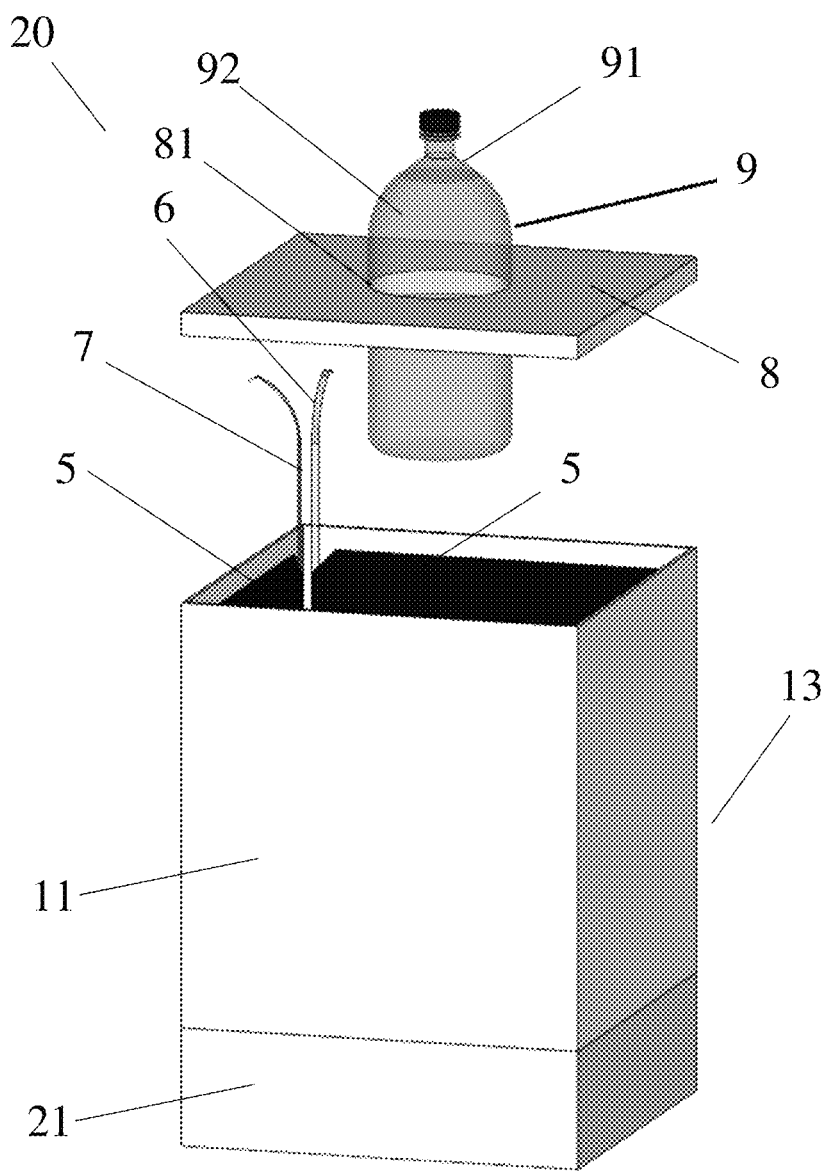
FIG. 6 is a perspective view of the solar power generator (20) with a cover (8) and a solar bulb (9) ready to be installed on the open side of the four-side box frame structure (13).
Figure 7:
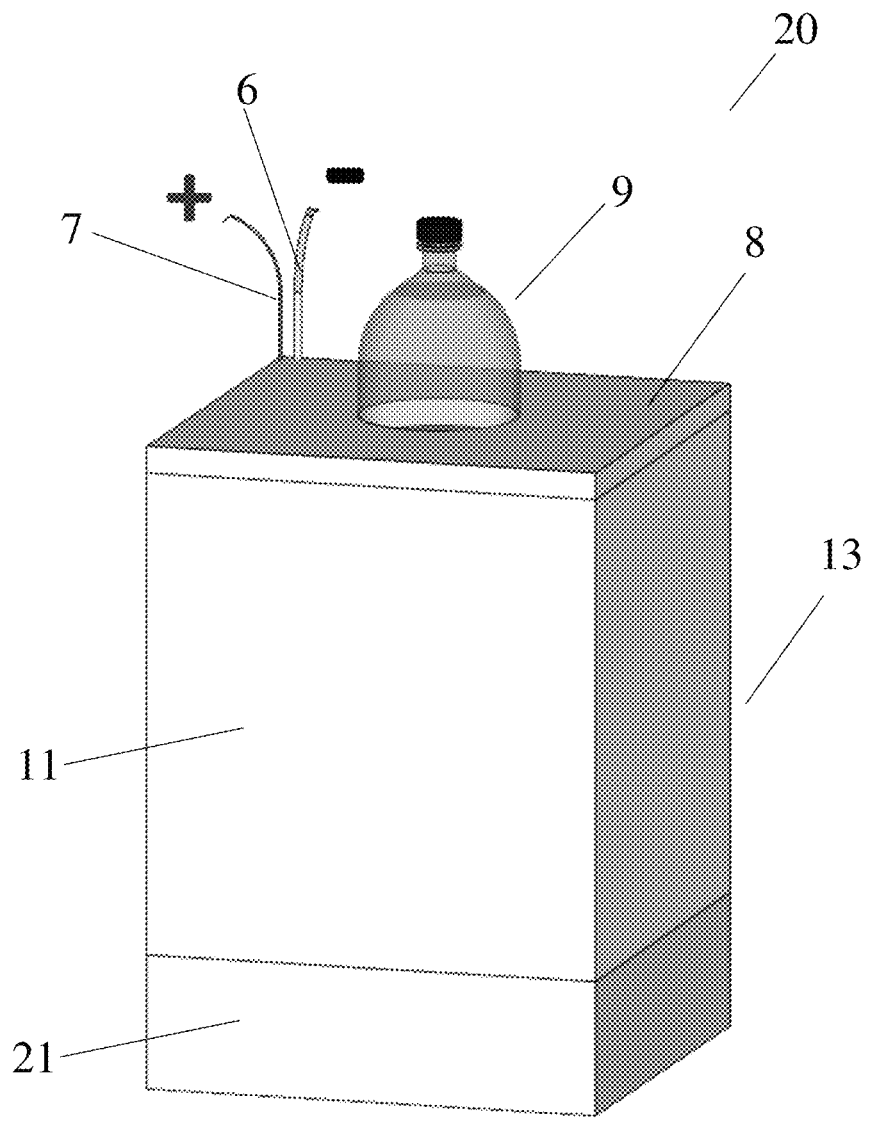
FIG. 7 is a perspective view of the solar power generator (20) as seen in FIG. 6 with a cover (8) and a solar bulb (9) mounted onto the open side of the four-side box frame structure (13).
Figure 8:
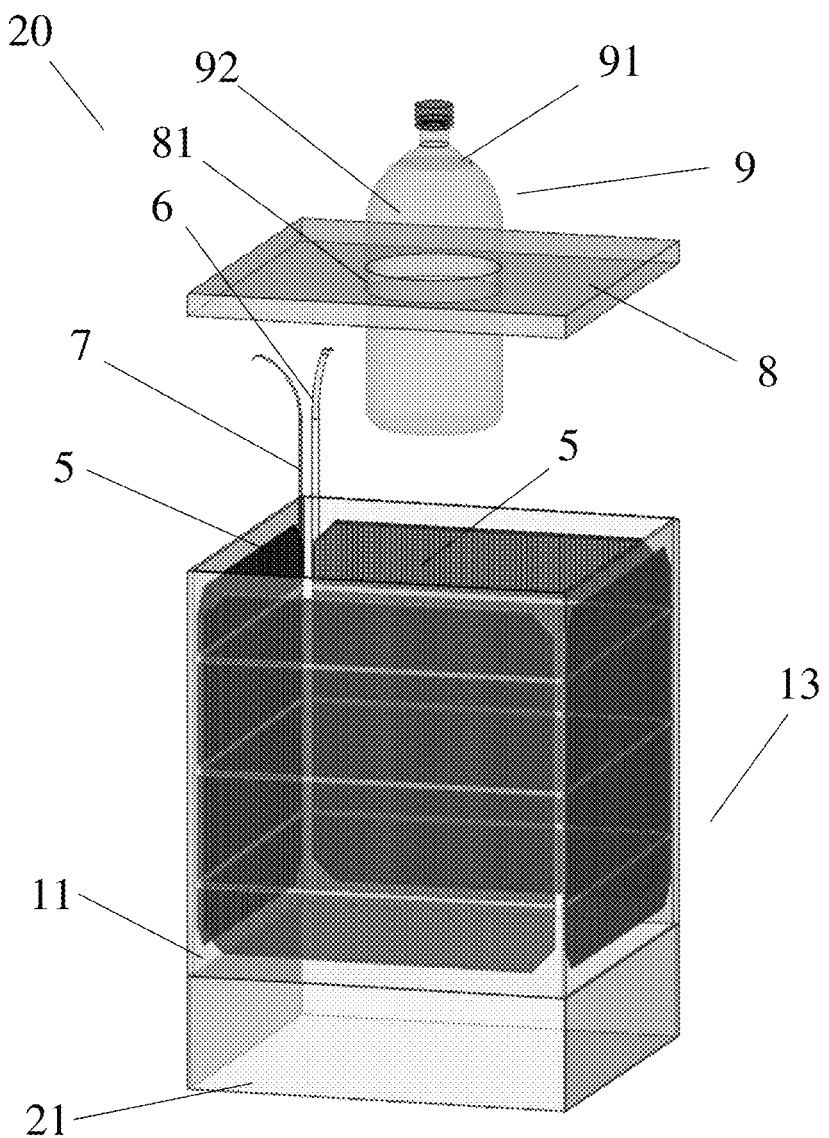
FIG. 8 is a transparent or X-ray view of the solar power generator (20) as seen in FIG. 5 for ease of understanding arrangement of parts.

FIGS. 4 to 8 illustrate elongated cardboard sheet (1) in folded form creating a four-side box frame structure (13). As seen in FIGS. 6 to 8 a cover (8) having a hole (81) and said cover (8) is mounted onto the open side of the four-side box frame structure (13). The cover (8) further comprises a hole (81) adapted for receiving a solar bulb (9). The solar bulb (9) comprising a transparent container (91) filed with a transparent liquid (92). The solar bulb (9) is mounted in the hole (81) of the cover (8) and the cover (8) is mounted on the four-side box frame structure (13) forming the solar power generator (20).

The solar bulb (9) as seen in FIGS. 6 to 8, 12 to 14 is configured so that a light from outer environment can travel through the solar bulb (9) into the four-side box frame structure (13) made by elongated sheet (1) and onto the photovoltaic solar panels (5) disposed therein generating electricity, and wherein the metal contacts (4), the electrodes (6; 7) and the photovoltaic solar panels (5) are connected in one common circuit so that the generated electricity can be transferred further from the solar power generator through said electrodes (6; 7). The transparent liquid (92) is a water and it further contains a bleach to inhibit algal growth. The transparent liquid (92) further contains light enhancing substance, preferably phosphorous base substance. Optionally, the solar bulb (9) may further comprises auxiliary reflection elements for increasing a light scattering within the aforementioned four-side box frame structure (13) of the solar power generator (20).

Figure 9:
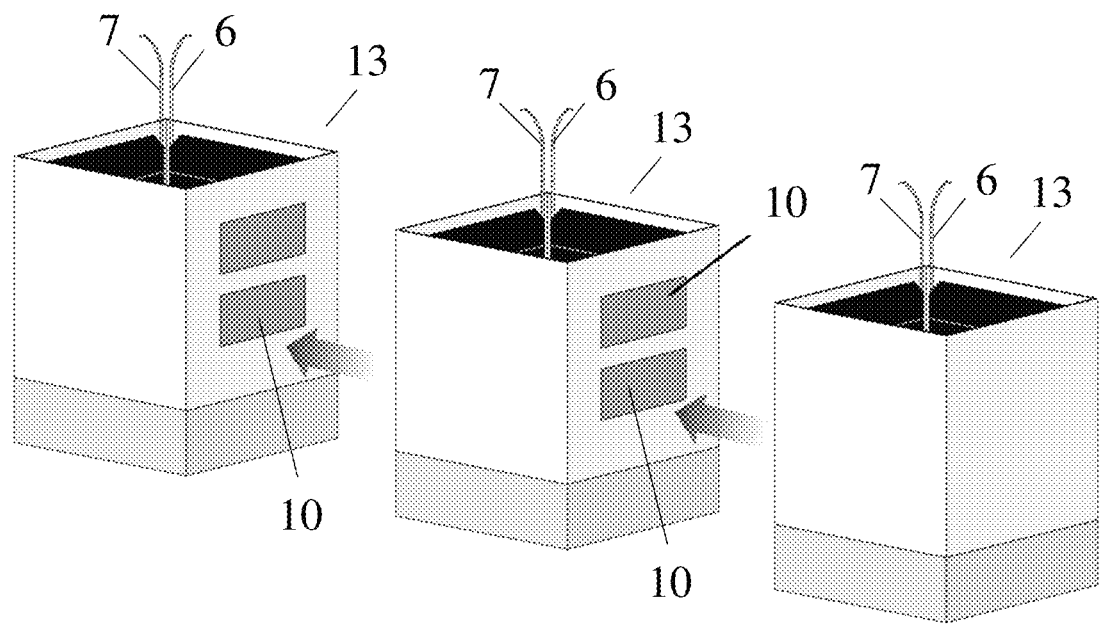
FIG. 9 illustrates an assembly of the solar power generators (20) to form a solar power generator unit (30).
Figure 10:
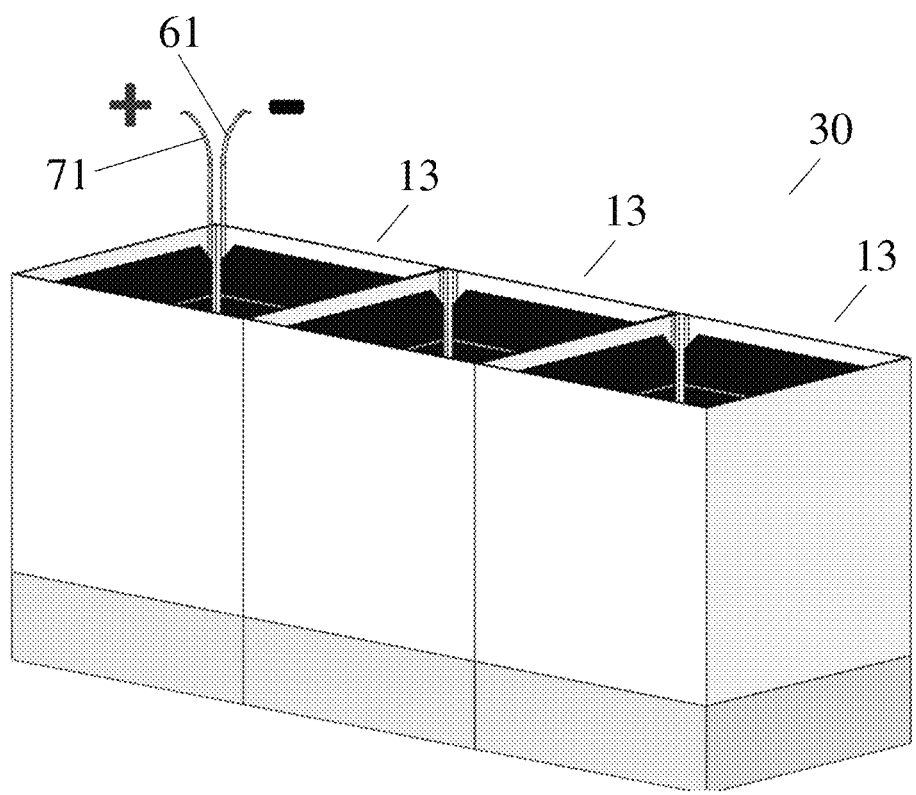
FIG. 10 illustrates assembled solar power generators (20) as seen in FIG. 9 into the solar power generator unit (30).
Figure 11:
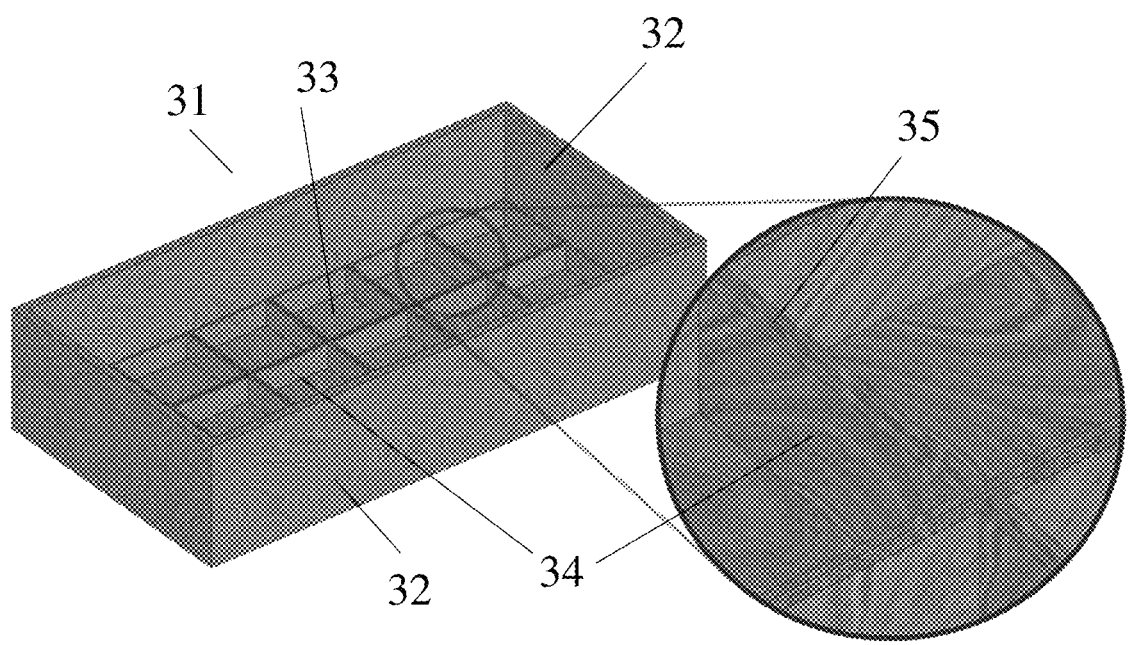
FIG. 11 is a perspective view of a container (31) with a zoom-in view on an array of protrusions (34) and grooves (35) on said protrusions (34).
Figure 12:
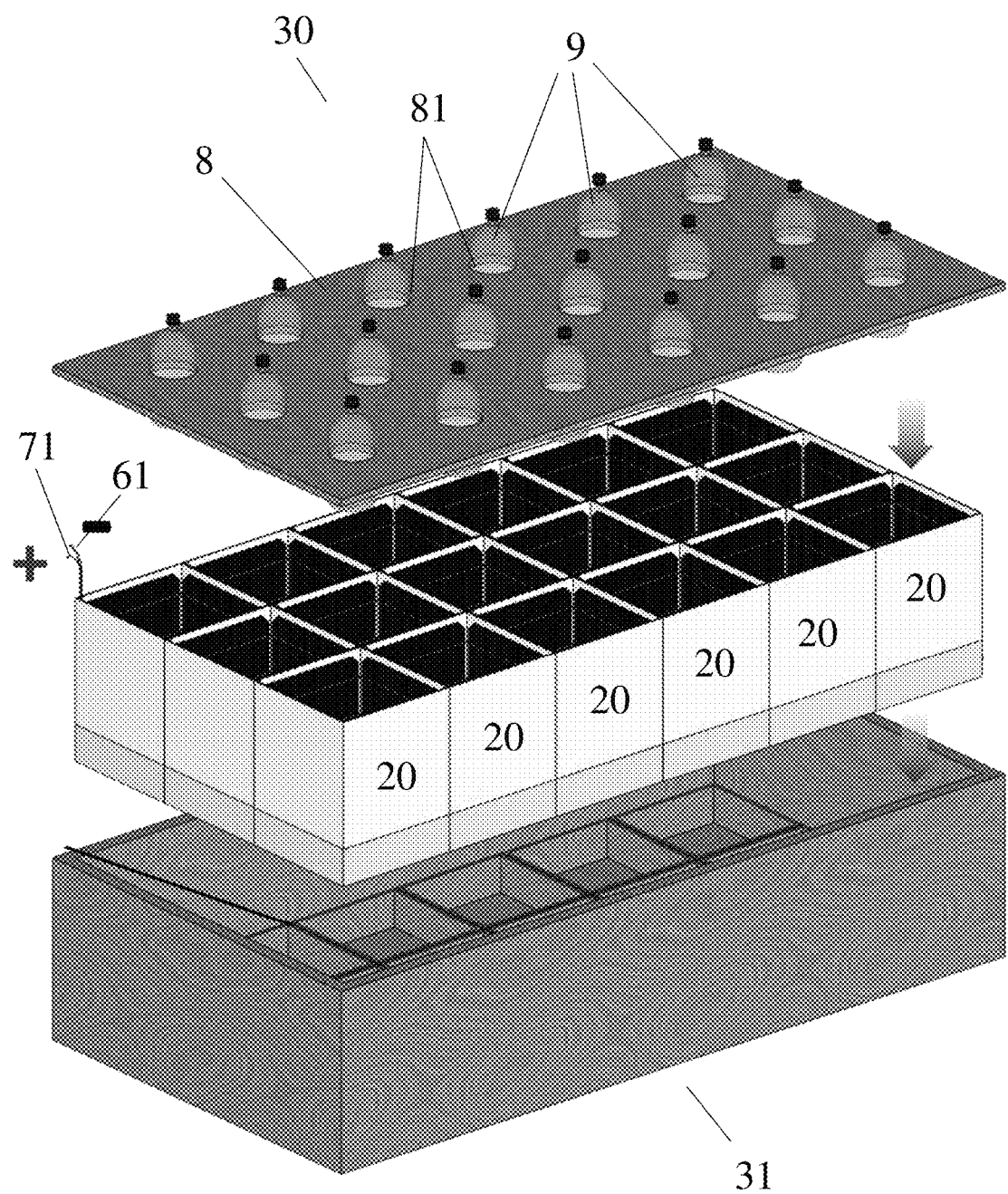
FIG. 12 is a perspective view of the solar power generator unit (30) just before assembly a set of the solar power generators (20) into the container (31) and covering these solar power generators (20) with the cover (8) having preinstalled solar bulbs (9).
Figure 13:
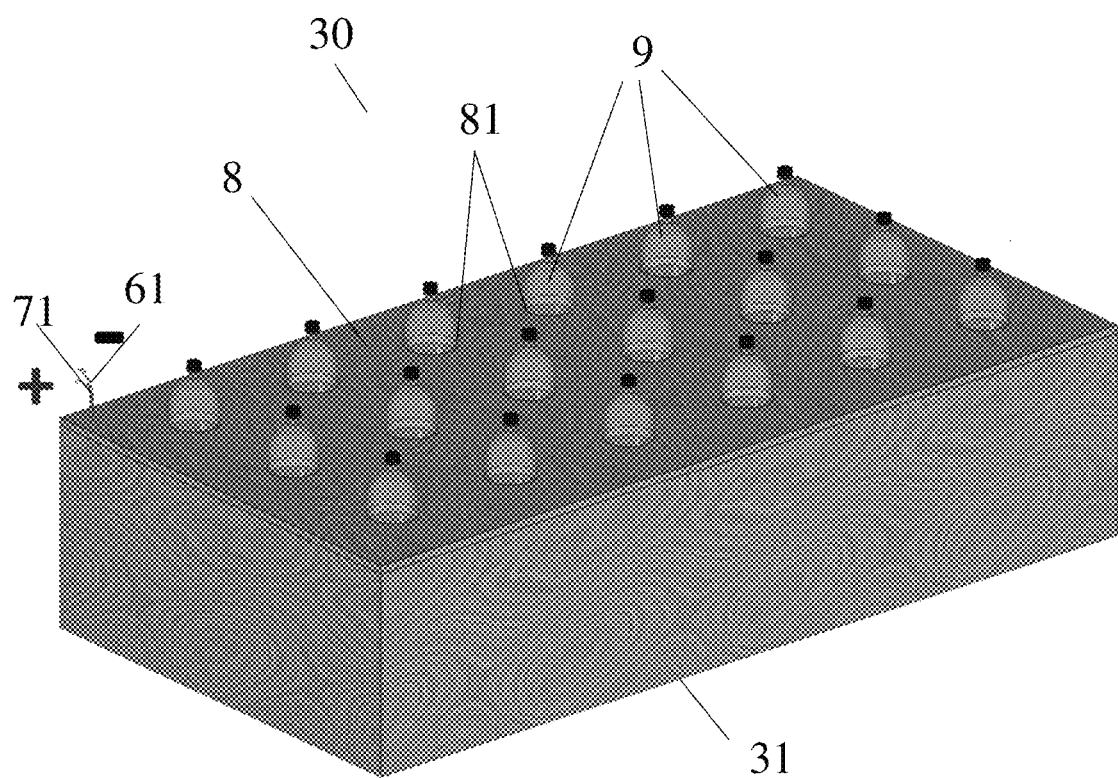
FIG. 13 is a perspective view of assembled solar power generator unit (30) as seen in FIG. 12.
Figure 14:
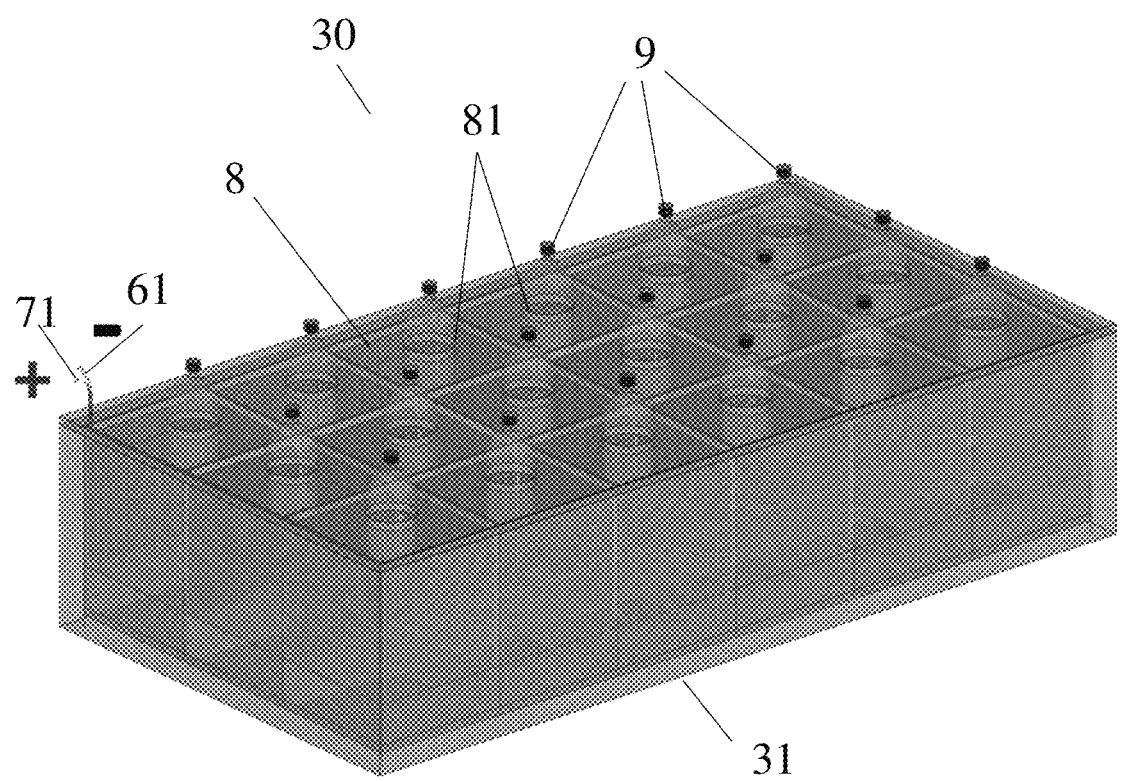
FIG. 14 is a transparent or X-ray view of assembled solar power generator unit (30) as seen in FIG. 13 for ease of understanding arrangement of parts.

The solar power generator (20) may work as a standalone device and it may also be connected in a cluster of the solar power generators (20) forming the solar power generator unit (30) as seen in FIGS. 12 to 14. The first step in manufacturing of the solar power generator unit (30) is interconnecting of the solar power generators (20) as seen in FIGS. 9 and 10. The solar power generators (20) are connected by means of a double-sided adhesive tape (10). Moreover, the solar power generators (20) are electrically interconnected to each other by means of electrodes (6; 7) forming common electrical circuit with one common output terminal having two electrodes (61; 71) as seen in FIG. 10. The solar power generator unit (30) comprises a container (31) with four side walls (32) and a base (33). The base (33) comprises an array of protrusions (34) and grooves (35) on said protrusions (34) configured to receive the thin part (21) of the elongated sheet (1) so that the cluster of the solar power generators (20) are securely positioned within the container (31). The solar power generator unit (30) further comprises the cover (8) that covers entire open side of the container (31) as seen in FIGS. 12 to 14. The cover (8) comprises multiple holes (81) disposed so that each hole (81) is positioned above each solar power generator (20), and wherein the solar bulb (9) is mounted in each hole (81) of the cover (8). Clustering said solar power generators (20) in one solar power generator unit (30) further increases effectiveness of proposed present invention.

While particular embodiments of the invention have been shown and described, numerous variations alternate embodiments will occur to those skilled in the art.

The invention claimed is:

1. A solar power generator (20) comprising:
    an elongated sheet (1) having three equally distributed folding lines (2) dividing the elongated sheet (1) in four generally equal parts (3) so that the elongated sheet (1) is foldable forming a four-side box frame structure (13);
    four photovoltaic solar panels (5), wherein each photovoltaic solar panel (5) is mounted onto each respective part (3) of the elongated sheet (1) and wherein four photovoltaic solar panels (5) are faced inwards to each other when the elongated sheet (1) is folded in the four-side box frame structure (13);
    metal contacts (4) embedded in the elongated sheet (1) in an area of the folding lines (2) of the elongated sheet (1) configured to be connected to the photovoltaic solar panels (5) in result of which the metal contacts (4) provide an electrical connection between neighbouring photovoltaic solar panels (5);
    electrodes (6; 7) connected to the photovoltaic solar panels (5) or to the metal contacts (4);
    a cover (8) having a hole (81) and said cover (8) is mounted onto the open side of the four-side box frame structure (13);
    a solar bulb (9) comprising a transparent container (91) filed with a transparent liquid (92), wherein the solar bulb (9) is mounted in the hole (81) of the cover (8), and wherein the solar bulb (9) is configured so that a light from outer environment can travel through the solar bulb (9) into the four-side box frame structure (13) made by elongated sheet (1) and onto the photovoltaic solar panels (5) disposed therein generating electricity, and wherein the metal contacts (4), the electrodes (6; 7) and the photovoltaic solar panels (5) are connected in one common circuit so that the generated electricity can be transferred further from the solar power generator through said electrodes (6; 7).

2. The solar power generator (20) according to claim 1, wherein each photovoltaic solar panel (5) is mounted to each part (3) of the elongated sheet (1) by means of double-sided adhesive tape (10).

3. The solar power generator (20) according to claim 1, wherein the elongated sheet (1) comprises a thick part (11) and a thin part (21) that is thinner than the thick part (11), and wherein the photovoltaic solar panels (5) are arranged on the thick part (11) of the elongated sheet (1).

4. The solar power generator (20) according to claim 1, wherein the transparent liquid (92) is a water and it further contains a bleach to inhibit algal growth.

5. The solar power generator (20) according to claim 1, wherein the transparent liquid (92) further contains light enhancing substance, preferably phosphorous base substance.

6. The solar power generator (20) according to claim 1, wherein the solar bulb (9) further comprises auxiliary reflection elements for increasing a light scattering within the solar power generator (20).

7. A solar power generator unit (30) comprising at least two solar power generators (20) according to claim 1.

8. The solar power generator unit (30) according to claim 7, wherein the solar power generators are connected together by means of a double-sided adhesive tape (10).

9. The solar power generator unit (30) according to claim 7, wherein the electrodes (6; 7) of each solar power generator (20) are connected to the electrodes (6; 7) of the neighbouring solar power generator (20) forming common circuit with two unit output electrodes (61; 71).

10. The solar power generator unit (30) according to, claim 7, wherein it further comprises a container (31) with four side walls (32) and a base (33), wherein the base (33) comprises an array of protrusions (34) and a groove (35) on said protrusion (34) configured to receive the thin part (21) of the elongated sheet (1) so that the solar power generators (20) are securely positioned within the container (31).

11. The solar power generator unit (30) according to claim 7, wherein the cover (8) covers entire open side of the container (31) and comprises multiple holes (81) disposed so that each hole (81) is positioned above each solar power generator (20), and wherein the solar bulb (9) is mounted in each hole (81) of the cover (8).

* * * * *